United States Patent [19]
Karube

[11] Patent Number: 5,192,876
[45] Date of Patent: Mar. 9, 1993

[54] FLAT PULSE GENERATOR

[75] Inventor: Koji Karube, Hinoshi, Japan

[73] Assignee: Hewlett-Packard Company, Palo Alto, Calif.

[21] Appl. No.: 749,507

[22] Filed: Aug. 16, 1991

Related U.S. Application Data

[63] Continuation of Ser. No. 425,755, Oct. 23, 1989, abandoned.

[30] Foreign Application Priority Data

Dec. 18, 1987 [JP] Japan .................................. 62-320846

[51] Int. Cl.$^5$ .......................... H03K 4/00; H03K 5/01; H03K 6/00
[52] U.S. Cl. .................................. 307/260; 307/263; 307/268; 307/491
[58] Field of Search ............... 307/263, 265, 268, 448, 307/279, 260, 491

[56] References Cited

U.S. PATENT DOCUMENTS

| | | | |
|---|---|---|---|
| 4,410,815 | 10/1983 | Ransom et al. | 307/448 |
| 4,661,725 | 4/1987 | Chantepie | 307/279 |
| 4,808,851 | 2/1989 | Chantepie | 307/448 |
| 4,825,110 | 4/1989 | Yamaguchi et al. | 307/448 |
| 4,871,931 | 10/1989 | Fitzpatrick et al. | 307/355 |
| 4,881,044 | 11/1989 | Kinoshita et al. | 330/253 |
| 4,912,520 | 3/1990 | Yamamoto et al. | 307/529 |
| 4,939,390 | 7/1990 | Coe | 307/279 |

FOREIGN PATENT DOCUMENTS 0117326  7/1984  Japan .................................. 307/450

OTHER PUBLICATIONS

Shahriary et al., "Practical Wide Band GaAs Phase Detector", IEEE Conf., Dallas, Tex., Jun. 1982.
"Dynamic Test System for High Speed Mixed Signal Devices", Kiyo Hiwada and Toshio Tamamura, International Test Conference 1987 Proceedings, Paper 15.3, Sep. 1-3, 1987, pp. 370-375.
"Reference Waveform Flat Pulse Generator", James R. Andrews et al., IEEE Transactions on Instrumentation and Measurement, vol. IM-32, No. 1, Mar. 1983, pp. 27-32.
"A Source Coupled FET Logic—A New Current-Mode Approach to GaAs Logics", Katsu et al., IEEE Transactions on Electron Devices, vol. ED-32, No. 6, Jun. 1985, pp. 1114-1118.
"8 Bit 1 ns Monolithic DAC", Tsutomu Kamoto et al., NIT Atsugi Electrical Communications Laboratories in VLSI Circuits.
"Spectrum Amplitude of Step-Like Waveforms Using the Complete-FFT Technique", Amr M. Shaarawi et al., IEEE Transactions on Instrumentation and Measurement, vol. IM-34, No. 4, Dec. 1985, pp. 537-540.
"GaAs IC High-Speed Frequency Divider Using Low-Power Source Coupled FET Logic (SCFL)", Matsushita Electronics Corp., pp. 29-36, Katsu et al.

Primary Examiner—Timothy P. Callahan

[57] ABSTRACT

A flat pulse generator (FPG) with a short settling time and high and low output levels which are both flat is achieved by using source coupled FET logic (SCFL). GaAs MESFETs may be used due to the wide allowable threshold voltage range of SCFL, thereby allowing very fast operation of the FPG. The FET sources of the SCFLs are commonly connected to a constant current source and are operated in the drain current saturation region so that gate-drain capacitance and hence feed-through capacitance is lowered. The feed-through capacitance is further reduced by cross connecting the SCFLs so that their feedthrough components cancel each other or by connecting small capacitors between the gate and drain of respective FETs. Due to such configurations, the drain voltage can be outputted directly so as to minimize the disturbance of the output wave form due to impedance mismatch.

14 Claims, 3 Drawing Sheets

FLAT PULSE GENERATOR

This is a continuation of application Ser. No. 425,755, filed Oct. 23, 1989, now abandoned.

BACKGROUND OF THE INVENTION

1. Field of the Invention

The present invention relates to a flat pulse generator (FPG) which can be used as a reference signal source for high-speed pulses and also as a calibration signal source for a digitizing oscilloscope, a linear LSI test system, or the like.

2. Description of the Prior Art

In recent years, the demand has been growing for high-speed and accurate measurement systems for the testing of high-speed D/A converters and the like. Although D/A converters with settling times as low as 1 ns are known, there is currently no measuring instrument which can satisfactorily measure the signals that settle at such high speeds in such devices, especially the high-speed settling signals that settle in less than 1 ns, with an accuracy of more than 8 bits. In such a circumstance, a signal that can be used as a reference is needed to enhance the accuracy of the conventional high-speed measuring instrument. However, such a signal must rise or fall in an extremely short time and then settle extremely rapidly.

The rising time of conventional instruments for measuring high-speed signals is quite short, for example, as short as 300 ps for an oscilloscope and some tens of picoseconds for a sampling type oscilloscope. However, such prior art oscilloscopes have an accuracy of only 6-8 bits of resolution. Moreover, the accuracy for such high speed operation is usually not specified on such oscilloscopes.

A conventional high speed flat pulse reference generator in accordance with the NBS standard is described in IEEE Transactions on Instrumentation and Measurement, Vol. IM-32, No. 1, pp. 27-32 (March 1983). Such an FPG has a transition duration of 600 ps, and it dampens all perturbations to less than ±10 mV within 5 ns. Improved versions of this FPG are disclosed in Japanese Patent application Nos. Showa 61-205627 and Showa 62-20992, filed by Yokagawa-Hewlett-Packard, Ltd. In addition, logic circuits using GaAs MESFETs (MEtal Semiconductor Field Effect Transistors) such as those disclosed by Katsu et al. in Shingaku Gihou SSD 81-83, in a paper entitled "GaAs IC High-Speed Frequency Divider Using Low-Power Source Coupled FET Logic SCFL)", Matsushita Electronics Corp., pp. 29-36 (an English paper with similar contents is IEEE Transactions on Electron Devices, Vol. ED-32, No. 6, pp. 1114-1118 (June, 1985), entitled "A Source Coupled FET Logic—A New Current-Mode Approach to GaAs Logics", by Katsu et al.), have been used as high-speed pulse circuits. The SCFL logic circuit described in these papers has a source follower circuit that acts as a level shifter for the drain voltage of one of the FETs to provide the level-shifted drain voltage as the output of the logic circuit. However, because these circuits are intended only for high-speed operation, these circuits have not been designed to generate a waveform necessary for use as the aforementioned reference signal.

Prior art FPGs of the type disclosed in the above-mentioned papers employ a diode clamper to shorten the rise time and to flatten the waveform after it rises. For this reason, only one of the two output levels of the FPGs can be flattened. As a result, only this flattened level can be used as the pulse reference. However, since the rise time of the output pulse depends on the input signal to the diode clamper, any input signal with a very high rising or falling speed may produce a significant amount of leakage due to its steep portion through the capacitance of the clamp diode.

Methods of analyzing a system using the output from an FPG of this kind as a calibration signal are disclosed, for example, in Japanese Patent application Nos. Showa 61-239737 and Showa 62-140614. These methods, however, present a serious problem. In particular, although a fast Fourier transform is the most effective as well as necessary means for signal analysis in the frequency domain, a pulse signal having only one flat level cannot be directly used because of the nature of a fast Fourier transform. Therefore, the prior art provides some modifications such as splicing the pulse signal in a pseudo manner with a signal the other side of which is of a flat level. An example of such techniques can be found in an article by Shaarawi et al. in IEEE Transactions on Instrumentation and Measurement, Vol. IM-34, No. 4, pp. 537-540 (December 1985), and entitled "Spectrum Amplitude of Step-Like Waveforms Using the Complete-FFT Technique". However, this method can introduce some error due to the splicing technique.

SUMMARY OF THE INVENTION

An object of the present invention is to provide a flat pulse generator which is free of the foregoing problems of the prior art and is capable of producing a signal having a waveform which rises or falls in an extremely short time and settles extremely rapidly so as to be preferable for use as the aforementioned reference signal.

In accordance with the invention, the flat pulse generator comprises at least one pair of FETs, each pair of FETs having commonly connected sources which are further connected to a current source. The flat pulse generator further comprises a first input terminal for applying a first input signal to a gate of one FET in each pair, a second input terminal for applying a second input signal which is in inverse-phase to the first input signal to a gate of the other FET in each pair, and an output terminal connected directly to a drain of one of the FETs.

A flat pulse generator in accordance with a first embodiment of the invention comprises a first pair of first and second FETs, a source of each of the first and second FETs being connected to a first common current source and a second pair of third and fourth FETs, a source of each of the third and fourth FETs being connected to a second common current source. The flat pulse generator further comprises a first input terminal for applying a first input signal to a gate of each of the first and fourth FETs, a second input terminal for applying a second input signal which is in inverse-phase to the first input signal to a gate of each of the second and third FETs, first and second drain resistors connected respectively to drains of the first and fourth FETs, the drains of the second and third FETs being respectively connected to the drains of the fourth and third FETs, and an output terminal connected directly to the drain of the fourth FET for providing a flat pulse.

A flat pulse generator in accordance with a second embodiment comprises a pair of first and second FETs, sources of the first and second FETs being commonly connected to a common current source, a first input terminal for applying a first input signal to a gate of the first FET, and a second input terminal for applying a second input signal which is in inverse-phase of the first input signal to a gate of the second FET. The flat pulse generator further comprises first and second drain resistors respectively connected to drains of the first and second FETs and an output terminal connected directly to the drain of the second FET for providing a flat pulse.

The SCFLs of the invention are preferably GaAs MESFETs which are operated in the drain current saturation region so that gate-drain capacitance and hence feed-through capacitance is lowered. Also, in the preferred embodiments, the feed-through capacitance is further reduced by cross connecting the SCFLs so that their feedthrough components cancel each other or by connecting small capacitors between the gate and drain of respective FETs. Alternatively, the flat pulse generator may also comprise a resistance connected between the commonly connected sources of the FETs and the common constant current source for purposes of stabilizing the constant current source to a frequency on the order of several GHz. Due to such configurations, the drain voltage can be outputted directly so as to minimize the disturbance of the output waveform due to impedance mismatch.

DETAILED DESCRIPTION OF THE PRESENTLY PREFERRED EMBODIMENTS

Figure 1:
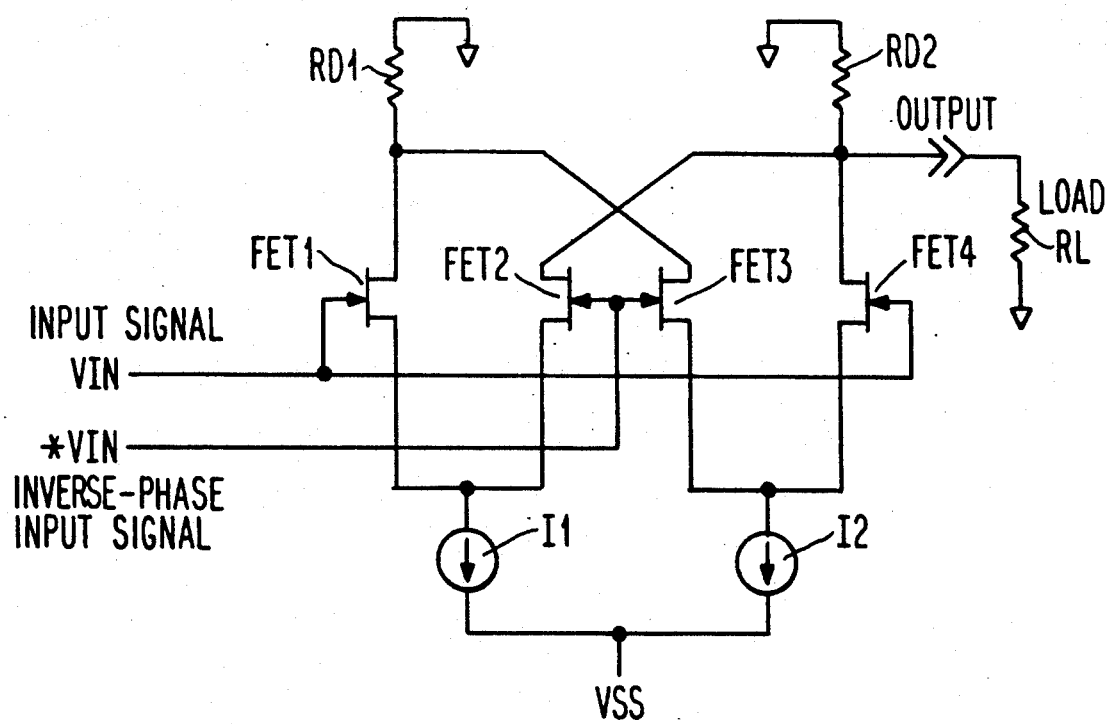
FIG. 1 is a circuit diagram illustrating a first embodiment of the present invention.

In accordance with the present invention, an FPG is provided which is constructed using a source coupled FET logic (SCFL) circuit of the general type proposed in the above-mentioned paper entitled "GaAs IC in High-Speed Frequency Divider Using Low-Power Source Coupled FET Logic (SCFL)". In such an FPG, the commonly coupled sources of the FETs are connected to a constant current source, and the flat pulse is obtained directly from between the drain of one of the FETs and a drain resistor. Such a configuration keeps the output impedance constant regardless of the output level of the FPG and produces output pulses with steep rising and falling edges and with both of their high and low levels flat. This circuit will now be described in further detail with respect to the drawing figures.

Figure 2A:
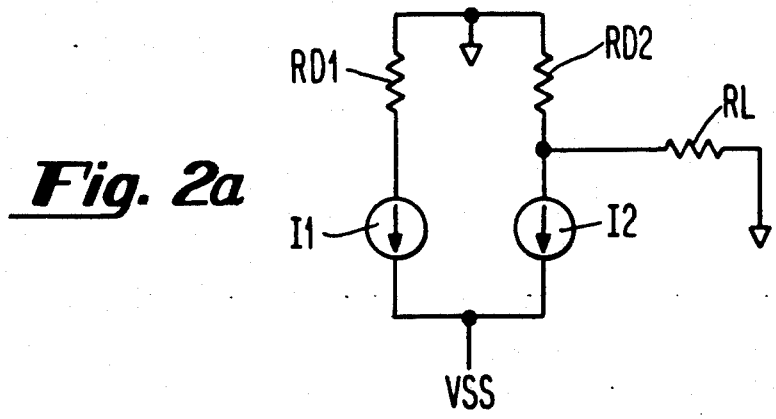
FIG. 2 shows equivalent circuits for illustrating the operation of the circuit of the embodiment of FIG. 1.
Figure 2B:
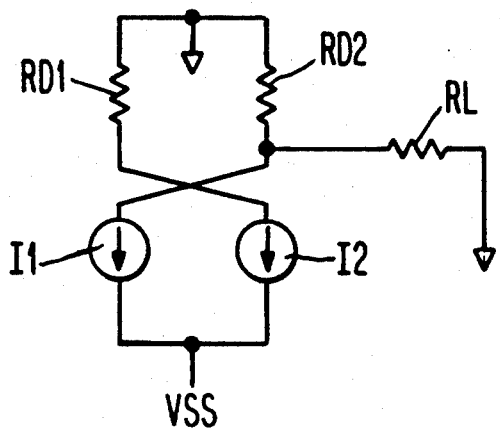

FIG. 1 illustrates a circuit of the first embodiment of the FPG in accordance with the present invention. As shown, the circuit includes a pair of GaAs MESFETs FET1 and FET2 and a pair of GaAs MESFETs FET3 and FET4, which together with constant current sources I1 and I2 comprise two SCFLs. These two SCFLs are driven by an input signal VIN and an inverse-phase input signal *VIN. When the input signal VIN=H level and the inverse-phase input signal *VIN=L level, the current flows through the path as shown in the equivalent circuit of FIG. 2(a). When the input signal VIN=L and the inverse-phase input signal *VIN=H, on the other hand, the current flows through the path as shown in FIG. 2(b). When the currents from the constant current sources are selected to be of different values in this manner, toggling of the input signal VIN and the inverse-phase input signal *VIN generates a rectangular pulse across a load RL.

The SCFL structure makes it easy to employ GaAs MESFETs as FET1-FET4, for although GaAs MESFETs generally tend to vary widely in their characteristics, this is of little consequence for an SCFL because of its wide threshold voltage range. Moreover, using GaAs MESFETs in the circuit structure as above makes it possible to operate at an extremely high speed due to the characteristics of high carrier mobility, lack of minor carrier accumulation, and the like of GaAs MESFETs. Furthermore, because an SCFL allows the FETs to operate within the drain current saturation region, the gate-drain capacitance becomes low, which decreases problems due to feedthrough capacitance, i.e., the leakage of the input signal to the output.

In the embodiment shown in FIG. 1, the two SCFLs are connected in parallel in a "mirror-image-like" manner to form an FPG. In other words, in the construction of FIG. 1, the slight feedthroughs generated in the individual SCFLs due to the input signal VIN and the reverse-phase input signal *VIN are coupled at the junction of the resistor RD1, FET1 and FET3, and at the junction of the resistor RD2, FET2 and FET4, in an inverse phase relation with each other. Thus, these feedthroughs cancel out each other, which in turn further improves the accuracy of the FPG. In addition, the combination of the two SCFLs makes possible an independent setting of each of the high level VH and the low level VL of the output.

In the circuit as shown in FIG. 1, the value of the drain resistor RD2 connected to the output terminal of the SCFL is made to coincide with the resistance value of the load RL. This allows impedance matching between the FPG and the load RL for both the high and low output levels, as is clearly understood from the equivalent circuits shown in FIG. 2. As a result, no disturbance in the waveform occurs which might otherwise be caused by the reflection. Moreover, the value of the other drain resistance RD1 of the SCFL is set to one half of value of the drain resistor RD2. This results in the value of the composite resistance of RD2 and RL being equal to that of RD1, whereby the loading condition of the current sources I1 and I2 is kept constant, as is seen from FIG. 2. This allows minimization of the disturbance due to the transient characteristics of the constant current sources I1 and I2.

Figure 3:
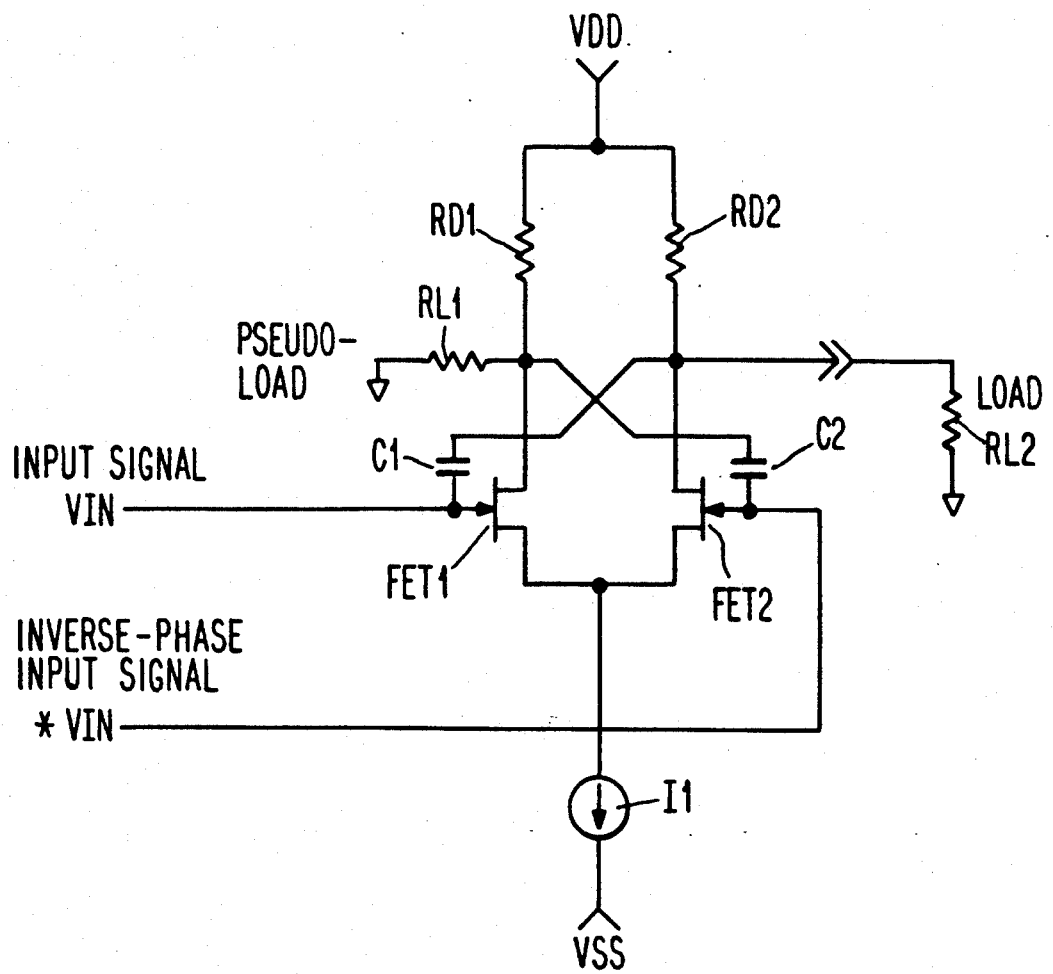
FIG. 3 is a circuit diagram illustrating a second embodiment of the present invention.

FIG. 3 illustrates a circuit of the second embodiment of the FPG in accordance with the present invention. This circuit is simplified with respect to that of FIG. 1 by replacing one of the SCFLs in FIG. 1 with capacitors C1 and C2 of very small capacitance. This configuration operates like the circuit of FIG. 1 and is particularly effective when the variations of the gate-drain capacitance of FET1 of FET2 are small. On the other hand, by providing a drain power source VDD, the circuit of FIG. 3 is free of the limitations of FIG. 1 whereby the drain resistors RD1 and RD2 are each placed between the drain and the ground so as to cause the output pulse of the FPG to be limited to a negative one when N-channel FETs are used and to a positive one for P-channel FETs.

Incidentally, in the configuration of FIG. 3, it is preferable to set the values of the two drain resistors RD1 and RD2 to be identical and to set the values of the load RL2 and the pseudo-load RL1 to be identical so that the loading condition of the constant current source I1 may be kept constant in terms of direct current as well. Also, the internal impedance of the drain power source VDD should be chosen to be sufficiently low.

Figure 4:
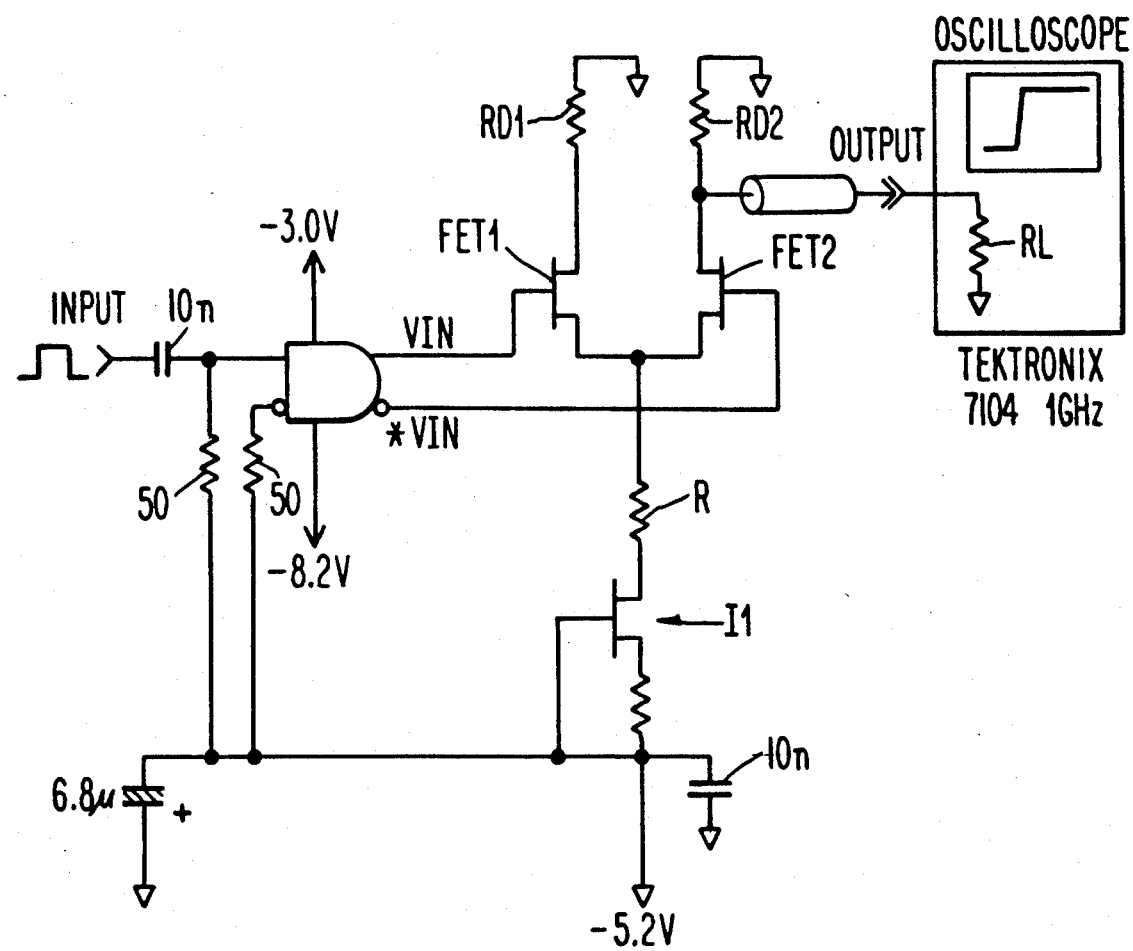
FIG. 4 shows a simplified arrangement of the circuit of FIG. 3, whereby the circuit of the invention is connected to an oscilloscope for performance testing.

FIG. 4 shows a simplified embodiment of the circuit of FIG. 3 which has been constructed for purposes of testing the performance of the flat pulse generator of the invention. The circuit of this figure differs from that of FIG. 3 in that resistance R is connected between the commonly connected sources of FET1 and FET2 and the FET of the constant current source I1 in order to stabilize the constant current source I1 around a frequency of several GHz. Pseudo-load RL1 may be combined into the drain resistor RD1 by setting the resistance value of RD1 to the combined resistance value of the parallel connected drain resistor RD2 and the load RL. The output available at the drain of FET2 may be measured directly by an oscilloscope, which may be, for example, a Tektronix 7104 with an operating frequency on the order of GHz.

Figure 5:
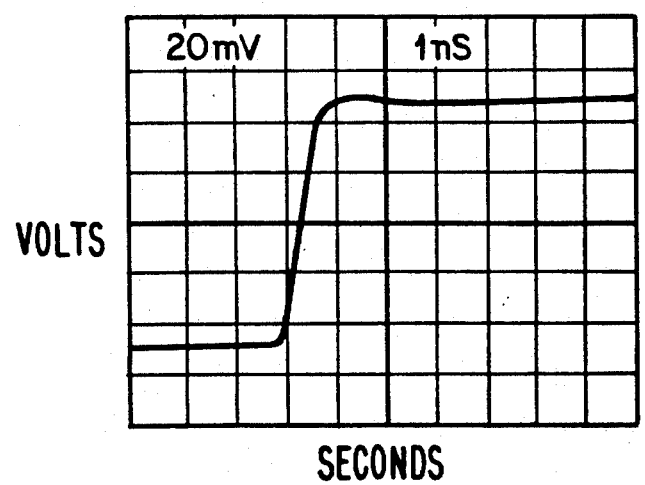
FIG. 5 shows the output waveform of the circuit of FIG. 4 as observed by an oscilloscope.

FIG. 5 shows the output waveform from the drain of FET2 as observed with the oscilloscope configured as shown in FIG. 4. As shown, the flat pulse generator of FIG. 4 has a very short rising time of about 400 picoseconds. Moreover, although the upper portion of the output waveform appears to be slightly bumpy in FIG. 5, such bumps seem to be caused by the characteristics of the oscilloscope used since different channels of the oscilloscope were observed to cause different bumps in the display. High speed settling signal may thus be measured with high accuracy using the simplified embodiment of FIG. 4.

Although the embodiments disclosed above use GaAs MESFETs as the FETs, other high-speed devices such as HEMT may be used as well. Additionally, although the invention has been disclosed for use with a "constant" current source, any current source with an internal impedance high enough to provide the required output will do. Also, when the reflection from the load is negligible, such as in the case where the load is connected to the other end of a sufficiently long cable so that the reflection does not return within the time of interest, the output of the FET may be supplied directly to the load as the current output. These and other such modifications of the invention are believed to be readily apparent to those of ordinarily skill in the art.

The configuration of the present invention uses the GaAs MESFETs or the like in the condition where the gate-drain capacitance is very low by using them in the drain current saturation region. This allows the FPG of the present invention to operate with sufficiently improved characteristics compared to FPGs of the prior art, even without the reduction of the feedthrough by canceling out the feedthroughs in the opposite phase to each other as indicated in FIGS. 1 and 3. Therefore, depending on the signal accuracy required, the "raw" output can be used without affecting the feedthrough cancellation, as shown in FIG. 4. In addition, in such a case, only the gate of one of the FETs may be driven while the other gate is fixed to a certain DC level.

The wide threshold range of the present invention makes it possible to employ GaAs MESFETs, which in turn allows the generation of pulses at an extremely high speed. Furthermore, because the output impedance is kept constant in any state, effecting the impedance matching with the transmission impedance along to the load prevents the flatness of the output pulses from being adversely affected by the reflected waves. Also, because the influence caused by the leakage of the input pulses is small, extremely flat output pulses can be generated.

Although only exemplary embodiments of this invention have been described in detail above, those skilled in the art will readily appreciate that several modifications are possible in the preferred embodiments without materially departing from the novel teachings and advantages of this invention. Accordingly, all such modifications are intended to be included in this invention as defined by the following claims.

What I claim is:

1. A flat pulse generator for providing a flat pulse signal, comprising:
   a pair of first and second FETs, said first and second FETs having commonly connected sources which are further connected to a current source;
   a first input terminal for applying a first input signal to a gate of said first FET;
   a second input terminal for applying a second input signal which is in inverse-phase to said first input signal to a gate of said second FET;
   a terminal for connecting a load directly to a drain of said second FET; and
   a first resistance connected between a drain of said first FET and ground and a second resistance connected between a drain of said second FET and ground, said first and second resistances having values whereby a composite resistance value between the drain of said second FET and ground when said load is connected thereto is the same as a composite resistance value between the drain of said first FET and ground such that a loading condition of said current source by said load is maintained at the same constant level before and after said first and second input signals change logic levels.

2. The flat pulse generator as set forth in claim 1, wherein said FEDs are GaAs MESFETs.

3. The flat pulse generator as set forth in claim 2, wherein said FEDs operate in their drain current saturation region.

4. The flat pulse generator as wet forth in claim 1, further comprising a resistance connected between the commonly connected sources of said first and second FETs and said current source for stabilizing said current source around a frequency of several GHz.

5. A flat pulse generator for providing a flat pulse signal, comprising:
   a first pair of first and second FETs, a source of each of said first and second FETs being connected to a first common current source;
   a second pair of third and fourth FETs, a source of each of said third and fourth FETs being connected to a second common current source;
   a first input terminal for applying a first input signal to a gate of each of said first and fourth FETs;
   a second input terminal for applying a second input signal which is in inverse-phase to said first input signal to a gate of each of said second and third FETs;
   an output terminal for connecting a load directly to a drain of said second and fourth FETs; and a first drain resistor connected between drains of said first and third FETs and ground and a second drain resistor connected between drains of said second and fourth FETs and ground, said first and second drain resistors having values whereby a composite resistance value between the drains of said second and fourth FETs and ground when said load is connected thereto is the same as a composite resistance value between the drains of said first and third FETs and ground such that loading conditions of said first and second common current sources by said load are maintained at the same constant level before and after said first and second input signals change logic levels.

6. The flat pulse generator as set forth in claim 5, wherein said FETs are GaAs MESFETs.

7. The flat pulse generator as set forth in claim 6, wherein said FETs operate in their drain current saturation region.

8. A flat pulse generator connected to a voltage source to provide a flat pulse signal, comprising:
   a pair of first and second FETs, sources of said first and second FETs being commonly connected to a common current source;
   a first input terminal for applying a first input signal to a gate of said first FET;
   a second input terminal for applying a second input signal which is in inverse-phase of said first input signal to a gate of said second FET;
   an output terminal for connecting a load directly to a drain of said second FET; and
   a first drain resistor connected between a drain of said first FET and a terminal of said voltage source and a second drain resistor connected between a drain of said second FET and a terminal of said voltage source, said first and second drain resistors having values whereby a composite resistance value between the drain of said second FET and ground when said load is connected thereto is the same as a composite resistance value between the drain of said first FET and ground such that a loading condition of said common current source by said load is maintained at the same constant level before and after said first and second input signals change logic levels.

9. The flat pulse generator as set forth in claim 8, further comprising a resistance connected between the commonly connected sources of said pair of first and second FETs and said common current source for stabilizing said common current source around a frequency of several GHz.

10. A flat pulse generator connected to a voltage source to provide a flat pulse signal, comprising:
   a pair of first and second FETs, sources of said first and second FETs being commonly connected to a common current source;
   a first input terminal for applying a first input signal to a gate of said first FET;
   a second input terminal for applying a second input signal which is in inverse-phase of said first input signal to a gate of said second FET;
   a first capacitor connected between said gate of said first FET and said drain of said second FET;
   a second capacitor connected between said gate of said second FET and said drain of said first FET;
   a pseudo-load connected to said drain of said first FET;
   first and second drain resistors respectively connected between drains of said first and second FETs and a terminal of said voltage source; and
   an output terminal for connecting a load directly to said drain of said second FET for providing said flat pulse signal.

11. The flat pulse generator as set forth in claim 10, wherein said FETs are GaAs MESFETs.

12. The flat pulse generator as set forth in claim 11, wherein said FETs operate in their drain current saturation region.

13. The flat pulse generator as set forth in claim 10, wherein the resistance values of said first and second drain resistors are substantially equal and the resistance values of said load and said pseudo-load are substantially equal.

14. A flat pulse generator connected to a voltage source to provide a flat pulse signal, comprising:
   a pair of first and second FETs, sources of said first and second FETs being commonly connected to a common current source;
   a first input terminal for applying a first input signal to a gate of said first FET;
   a second input terminal for applying a second input signal which is in inverse-phase of said first input signal to a gate of said second FET;
   an output terminal for connecting a load directly to a drain of said second FET; and
   first and second drain resistors respectively connected between drains of said first and second FETs and a terminal of said voltage source, said second drain resistor and said load having substantially coincident resistance values and said first drain resistor having a resistance value approximately one-half that of said second drain resistor, whereby a composite resistance of said second drain resistor and said load substantially equals the resistance value of said first drain resistor.

* * * * *